United States Patent [19]

Shinkawata

[11] Patent Number: 5,796,136
[45] Date of Patent: Aug. 18, 1998

[54] DRAM SEMICONDUCTOR DEVICE WITH COMPOSITE BIT LINE

[75] Inventor: Hiroki Shinkawata, Hyogo, Japan

[73] Assignee: Mitsubishi Denki Kabushiki Kaisha, Tokyo, Japan

[21] Appl. No.: 612,524

[22] Filed: Mar. 8, 1996

[30] Foreign Application Priority Data

Oct. 26, 1995 [JP] Japan ............... 7-278924

[51] Int. Cl.⁶ ............................ H01L 27/108
[52] U.S. Cl. ............... 257/306; 257/310
[58] Field of Search ............... 257/306, 310

[56] References Cited

U.S. PATENT DOCUMENTS

| | | | |
|---|---|---|---|
| 5,134,086 | 7/1992 | Ahn | 437/52 |
| 5,158,905 | 10/1992 | Ahn | 257/310 |
| 5,242,852 | 9/1993 | Matsuyama et al. | 437/52 |
| 5,381,365 | 1/1995 | Ajika et al. | 257/306 |
| 5,539,231 | 7/1996 | Suganaga et al. | 257/306 |
| 5,561,311 | 10/1996 | Hamamoto et al. | 257/306 |
| 5,583,358 | 12/1996 | Kimura et al. | 257/306 |

OTHER PUBLICATIONS

Jeffrey Marks et al, "Etching Using High Density Plasma", pp. 68–75, Semiconductor World 1993, no month.

*Primary Examiner*—Gene M. Munson
*Attorney, Agent, or Firm*—McDermott, Will & Emery

[57] ABSTRACT

N⁺ impurity diffusion layers, and a gate electrode are formed on a major surface of a p-type semiconductor substrate. An insulating layer, and interlayer insulating layers are formed to cover gate electrode. An interconnection layer provided with a hole is formed on interlayer insulating layer. A contact hole is provided in interlayer insulating layer and a column-like portion is formed within the contact hole and hole. The column-like portion and interconnection layer constitute a bit line. Thus, the resistance of the bit line can be reduced and the manufacturing process of the device can be simplified.

8 Claims, 14 Drawing Sheets

5,796,136

DRAM SEMICONDUCTOR DEVICE WITH COMPOSITE BIT LINE

BACKGROUND OF THE INVENTION

1. Field of the Invention

The present invention relates to a semiconductor memory device and manufacturing method thereof and more particularly, to a semiconductor memory device having bit lines and capacitors.

2. Description of the Background Art

Various semiconductor memory devices have been proposed. In particular, DRAM (Dynamic Random Access Memory) is one of the best known semiconductor devices. Details of DRAM are as follows.

As the cell area of the most advanced DRAM of recent years has been reduced, even if it is provided with a three dimensional capacitor structure (cylinder type, fin type, trench type, etc.) utilizing a conventional silicon oxynitride film, to obtain enough capacitance of a capacitor is becoming difficult. Therefore, a dielectric film used for a capacitor should be replaced by the one with a higher dielectric constant. An example of DRAM using such a dielectric film with a higher dielectric constant is shown in FIG. 23. FIG. 23 is a cross sectional view illustrating a conventional DRAM utilizing a dielectric film of a higher dielectric constant.

With reference to FIG. 23, a field oxide film 2 is selectively formed on a major surface of a p-type semiconductor substrate 1. $N^+$ impurity diffusion layers 3 are formed spaced apart from each other in the major surface of substrate 1 surrounded by field oxide film 2. At the edge of $n^+$ impurity diffusion layer 3, an $n^-$ impurity diffusion layer 3a is formed. On a channel region defined by a pair of $n^+$ impurity diffusion layers 3, a gate electrode 5 (word line) is formed with a gate insulating layer 4 interposed. On the other hand, another gate electrode 5 is extended over field oxide film 2.

An insulating layer 6 formed of silicon oxide film or the like is formed to cover gate electrode 5. An interlayer insulating layer 7a formed of silicon oxide film or the like is formed to cover the insulating layer 6. In interlayer insulating layer 7a, a contact hole 8b which reaches prescribed $n^+$ impurity diffusion layer 3 is formed. A bit line 11 is formed within contact hole 8b. As shown in FIG. 23, bit line 11 is provided such that it extends along the side walls and the bottom of contact hole 8b.

An interlayer insulating layer 7b formed of silicon oxide film or the like is formed to cover bit line 11 and interlayer insulating layer 7a. A capacitor 16 is formed on interlayer insulating layer 7b. Capacitor 16 is constituted by a lower electrode 13, a dielectric film 14, and an upper electrode 15. Material of a high dielectric constant is used as dielectric film 14. For example, high dielectric material and ferroelectric material such as oxide ceramics like (Ba, Sr) $TiO_3$, $BaTiO_3$, $SrTiO_3$, $PbTiO_3$, $PbZrO_3$, $LiNbO_3$, PZT, PLZT can be used. In addition, in order to use dielectric film 14 of above material, lower electrode 13 and upper electrode are required to be formed of metal such as Pt, Pd, Rh, Ni, W or alloy such as Pt, Pd, Rh, Ni, W, or metal stacked film such as $Ru/RuO_2$, $Ir/IrO_2$.

A barrier layer (diffusion preventing layer) 12 is formed between lower electrode 13 and interlayer insulating layer 7b. Barrier layer 12 can be formed by stacked layers formed of Ti type material such as TiN/Ti. It is noted that a side wall insulating layer 31 is formed on the side wall of lower electrode 13, and dielectric film 14 and upper electrode 15 are extended on side wall insulating layer 31.

Then an interlayer insulating layer 19 formed of silicon oxide film or the like is formed to cover the capacitor 16, and on this interlayer insulating layer 19, a metal interconnection layer 20 formed of material including Al or the like is formed.

Next, the manufacturing method of the conventional DRAM illustrated in FIG. 23 is described referring to FIGS. 24 and 25. FIGS. 24 and 25 are cross sectional views showing the characteristic first and second process steps of the manufacturing process of the DRAM shown in FIG. 23.

With reference to FIG. 24 first, field oxide film 2 is formed on a major surface of p-type semiconductor substrate 1 using LOCOS (Local Oxidation of Silicon) or the like. Then, gate insulating layer 4 is formed on the major surface of semiconductor substrate 1 using thermal oxidation method or the like, and a polycrystalline silicon layer is formed on gate insulating layer 4 using CVD (Chemical Vapor Deposition) or the like. After forming gate electrode 5 by patterning the polycrystalline silicon layer to a prescribed shape, $n^-$ impurity diffusion layer 3a is formed by ion implantation and diffusion.

Insulating layer 6 is then formed to cover gate electrode 5 and n-type impurities are introduced into the major surface of semiconductor substrate 1 using insulating layer 6 as a mask, then $n^+$ impurity diffusion layer 3 is formed. Next, interlayer insulating layer 7a is formed to cover gate electrode 5 and insulating layer 6 using CVD or the like. Contact hole 8b is then formed in interlayer insulating layer 7a by photolithography and etching. A conductive layer is deposited within contact hole 8b and on interlayer insulating layer 7a using CVD, sputtering or the like. Then, bit lines 11 is formed by patterning the conductive layer.

Referring to FIG. 25 next, interlayer insulating layer 7b is formed by CVD or the like to cover bit line 11 and interlayer insulating layer 7a. Then, contact holes 8a and 8c are formed using photolithography and etching.

After above steps, a polycrystalline silicon layer is deposited such that it fills contact holes 8a and 8c utilizing CVD or the like, and plug electrodes 9a and 9c are formed respectively, for example by etching back the polycrystalline silicon layer. Then, barrier layer 12 formed of TiN/Ti or the like is formed using sputtering, MOCVD (Metal Organic CVD) or the like to provide lower electrode 13 formed of Pt or the like on the barrier layer 12. After patterning lower electrode 13 and barrier layer 12 to a prescribed shape, side wall insulating layer 31 is formed on their side wall.

Next, sputtering, MOCVD or the like is used to successively deposit dielectric film 14 and upper electrode 15. Interlayer insulating layer 19 is then formed by CVD or the like to cover upper electrode 15 and metal interconnection layer 20 is formed on interlayer insulating layer 19. The DRAM shown in FIG. 23 is thus formed through these process steps described above.

However, the conventional DRAM thus described has some problems as will be described below. As the size of a DRAM is scaled down, the resistance/capacitance of bit line 11, the resistance of the contact portion of the bit line and the like affect the access time which is an important performance of the DRAM. Measures have been taken such as using bit line 11 formed of material with low resistance (for example, a polycide structure formed of W or Ti and polycrystalline silicon). Even if those measures are provided, the resistance of bit line 11 is not decreased enough for the most advanced DRAM, and the resistance still affects the access time.

The delay of signals may be reduced by decreasing the number of memory cells connecting to one bit line 11.

However, to reduce the number of the memory cells connecting to bit line 11 will lead to the increase of the number of sense amplifiers, which inturn leads to increase of the area of the peripheral circuit, resulting in the increase of the chip area. Therefore, in the conventional technique, sufficient reduction of the resistance value of bit line 11 has been extremely difficult when the size of DRAM is scaled down.

On the other hand, as illustrated in FIGS. 24 and 25, contact hole 8b for the formation of bit line 11 and contact holes 8a, 8c for the formation of plug electrodes 9a, 9c are provided by the separate process steps. Therefore, the photolithographic process and the etching process have to be repeated twice in order to form contact holes 8a, 8b, and 8c, making the manufacturing process complicated. In addition, the necessity of two photo masks leads to the higher manufacturing cost.

SUMMARY OF THE INVENTION

The present invention is made to solve above problems. An object of the invention is to provide a semiconductor memory device which makes it possible to sufficiently reduce the resistance of a bit line even if the size of the device is scaled down.

Another object of the present invention is to provide a manufacturing method of a semiconductor memory device which makes it possible to reduce the manufacturing cost of the device by simplifying the manufacturing process.

A semiconductor memory device in accordance with the invention is provided with a semiconductor substrate of a first conductivity type having a major surface, first and second impurity diffusion layers of a second conductivity type, a gate electrode, a bit line, and a capacitor. The first and the second impurity diffusion layers are formed provided with a space therebetween such that they define a channel region at the major surface of the semiconductor substrate. The gate electrode is formed on the channel region with a gate insulating layer interposed. The bit line is provided on the surface of the first impurity diffusion layer and has a protruded portion at the upper surface located above the contact portion with the first impurity diffusion layer. The capacitor is electrically connected with the second impurity diffusion layer.

As stated above, a semiconductor memory device according to the present invention is provided with the protruded portion of the bit line located above the contact portion of the bit line with the first impurity diffusion layer. Increase in the volume of the bit line located above the contact portion becomes possible by providing the protruded portion. Then, the reduction of the resistance of the bit line located above the contact portion becomes possible. In this way, the performance of a semiconductor memory device can be improved.

In the manufacturing method of a semiconductor memory device according to the invention, first and second impurity diffusion layers of a second conductivity type are formed spaced apart such that they define a channel region at a major surface of a semiconductor substrate of a first conductivity type. A gate electrode is formed on the channel region with a gate insulating layer interposed. A first interlayer insulating layer is provided to cover the gate electrode and the first and the second impurity diffusion layers. Next, a conductive layer is formed on the first interlayer insulating layer to cover the first impurity diffusion layer without overlapping the second impurity diffusion layer. A second interlayer insulating layer is formed, covering the conductive layer and the first interlayer insulating layer. A first contact hole penetrating through the first and the second interlayer insulating layers and the conductive layer is formed on the first impurity diffusion layer, and a second contact hole penetrating through the first and the second interlayer insulating layers is formed on the second impurity diffusion layer simultaneously. The conductive layer is buried in the first and the second contact holes, then first and second buried conductive layers connected electrically to the first and the second impurity diffusion layers are formed. A capacitor is then provided on the second interlayer insulating layer such that it is electrically connected to the second buried conductive layer.

As described above, in the manufacturing method of a semiconductor memory device according to the invention, it is possible to simultaneously form the first contact hole for forming the bit line and the second contact hole provided for forming the buried conductive layer electrically connecting the capacitor and the second impurity diffusion layer. Therefore, it becomes possible to considerably simplify the manufacturing process compared with the conventional method in which the first and second contact holes are formed in separate process steps. It also becomes possible to reduce the number of photo masks since the first and the second contact holes can be formed in the same process step. As a result, the significant reduction of the manufacturing cost would be possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1–22.

[Embodiment 1]

Figure 1:
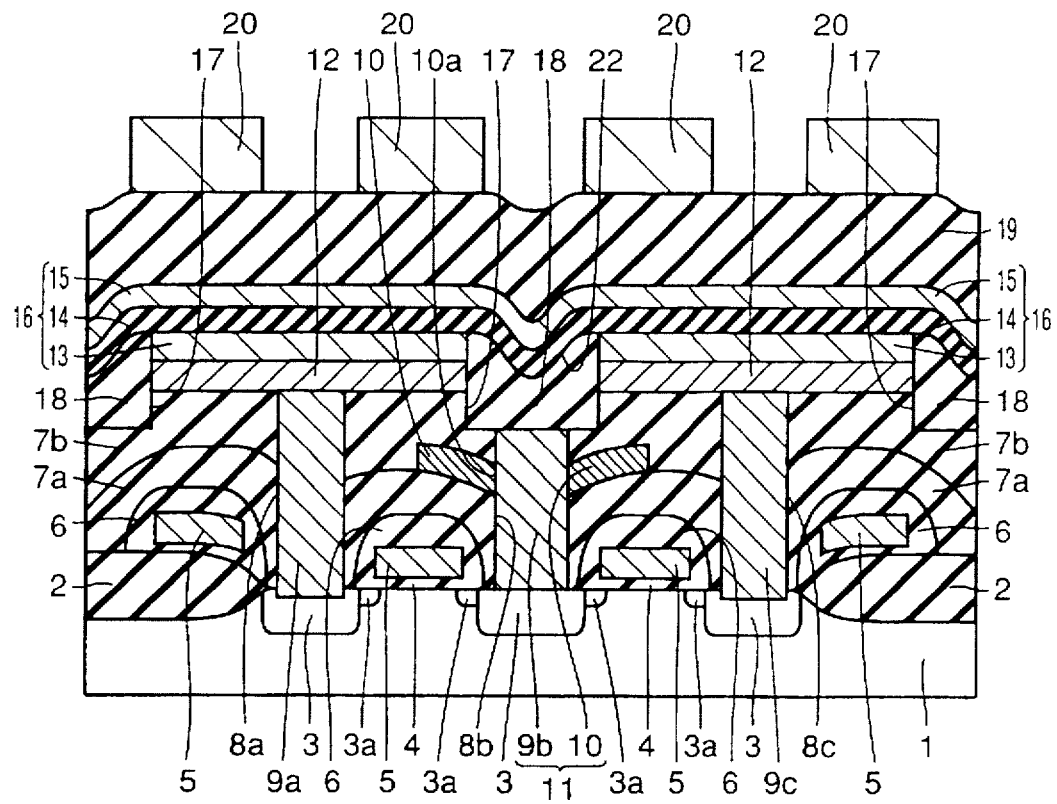
FIG. 1 is a cross sectional view showing a semiconductor memory device in the first embodiment of the present invention.

First, Embodiment 1 and its modification will be described with reference to FIGS. 1–14. FIG. 1 is a cross sectional view showing a semiconductor memory device in the Embodiment 1 of the present invention.

Figure 23:
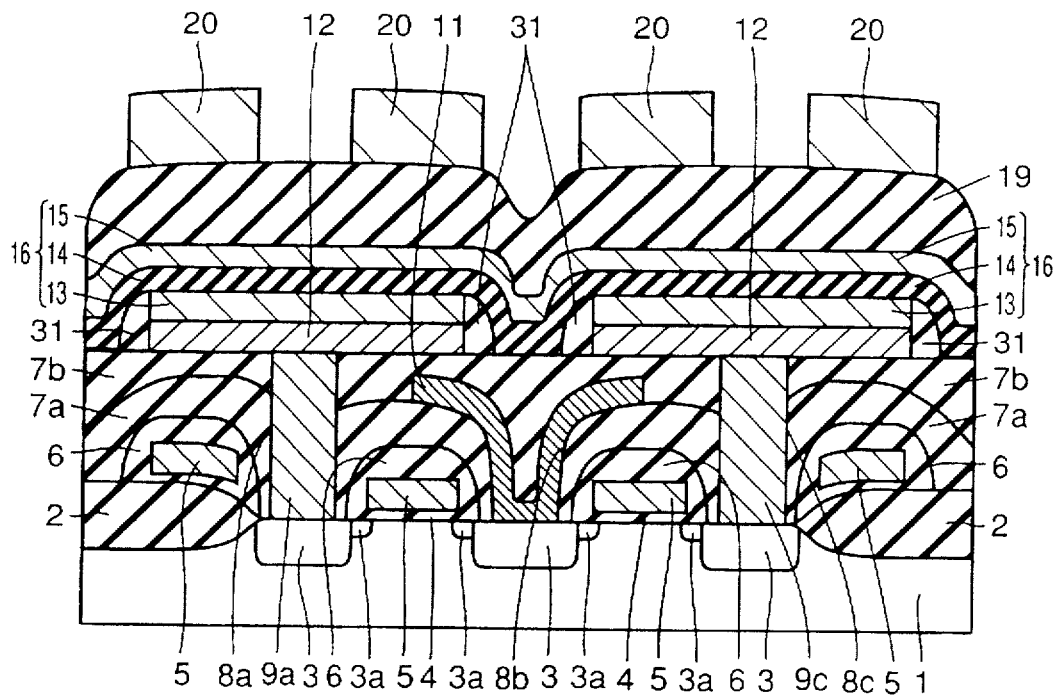
FIG. 23 is a cross sectional view showing a conventional semiconductor memory device.
Figure 24:
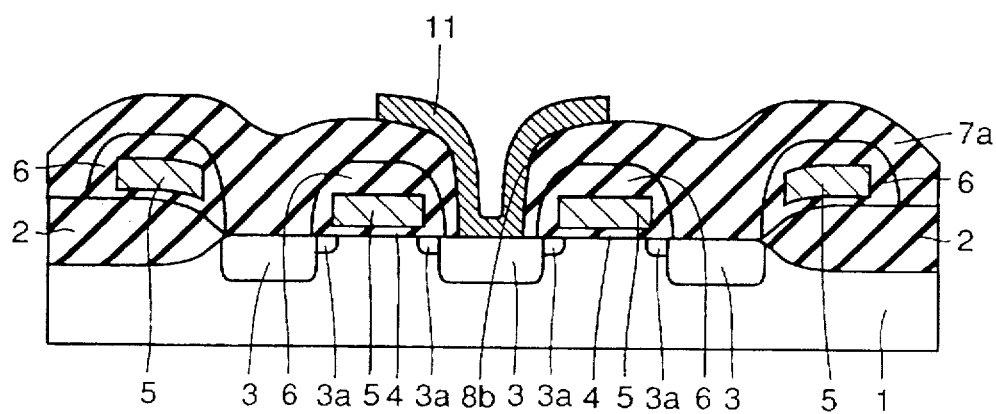
FIGS. 24 and 25 are cross sectional views showing the characteristic first and second process steps of the manufacturing process of a conventional semiconductor memory device.
Figure 25:
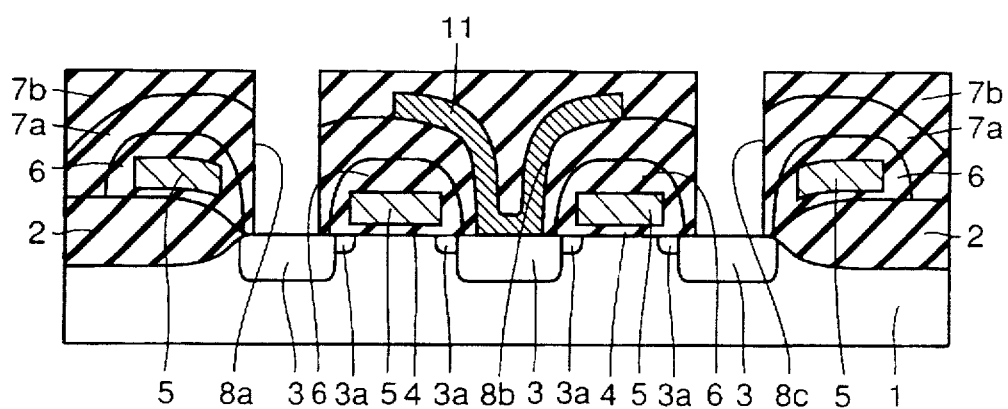

With reference to FIG. 1, in a semiconductor memory device according to the present invention, a bit line 11 is constituted by a column-like portion 9b and an interconnection layer (film-like portion) 10. A trench 17 is provided on bit line 11 and a buried oxide film 18 is formed within trench 17. Other structures of the device are similar to those of the conventional device illustrated in FIG. 23, therefore the description thereof will not be repeated.

As described above, bit line 11 is constituted by column-like portion 9b and interconnection layer (film-like portion) 10. A hole 10a is provided in interconnection layer 10 and column-like portion 9b is formed such that it extends in hole 10a. The upper part of column-like portion 9b is protruded from the top surface of interconnection layer 10 as shown in FIG. 1, then a protruded portion is formed. The formation of the protruded portion makes it possible to increase the volume of bit line 11 located on the contact portion of bit line 11 with an $n^+$ impurity diffusion layer 3, compared to the conventional device. Thus, decrease in the resistance of bit line 11 on the contact portion becomes possible. It is noted that a bit line is not limited to the structure shown in FIG. 1, and any structure may be used if it is provided with a protruded portion on the top of the bit line located on the contact portion of bit line 11 with the $n^+$ impurity diffusion layer 3 immediately under the bit line 11.

Trench 17 is formed on bit line 11 as illustrated in FIG. 1. The top surface of column-like portion 9b constitutes a part of the bottom surface of a prescribed trench 17. Trench 17 is provided such that it has its bottom surface within an interlayer insulating layer 7b and sandwiches a lower electrode 13 of a capacitor 16. A buried oxide film 18 is then formed within trench 17.

Buried oxide film 18 is formed to cover all of the bottom surface of trench 17 and almost all of the side trench 17, then a concave portion 22 is formed on the top surface of buried oxide film 18. The bottom surface of concave portion 22 is preferably positioned above the bottom surface of a barrier layer 12, and it is possible to form such a structure. The top surface of buried oxide film 18 could thus have a gentle slope.

A dielectric film 14 is extended on buried oxide film 18, so the gently sloping top surface of buried oxide film 18 could effectively prevent dielectric film 14 on buried oxide film 18 from becoming thinner. Thus, leak current due to the thinner dielectric film 14 could be effectively prevented. As a result, the reliability of a semiconductor memory device could be improved. It is noted that buried oxide film 18 could be replaced with another insulating layer.

It is also noted that plug electrodes 9a and 9c and column-like portion 9b may be formed of the same material.

In that case, plug electrodes 9a and 9c and column-like portion 9b are formed of polycrystalline silicon. On the other hand, interconnection layer 10 may be formed of low resistance metal such as W, or metal silicide with high melting point, or a film having a polycide structure. In other words, interconnection layer 10 and column-like portion 9b may be formed of different material. Preferably, material which easily fills contact hole 8b is selected for column-like portion 9b, and material which has low resistance is selected for interconnection layer 10.

Next, with reference to FIGS. 2–10, a method of manufacturing the semiconductor memory device shown in FIG. 1 will be described. FIGS. 2–10 are cross sectional views showing the characteristic first through ninth steps for manufacturing the semiconductor memory device according to the Embodiment 1 shown in FIG. 1.

Figure 2:
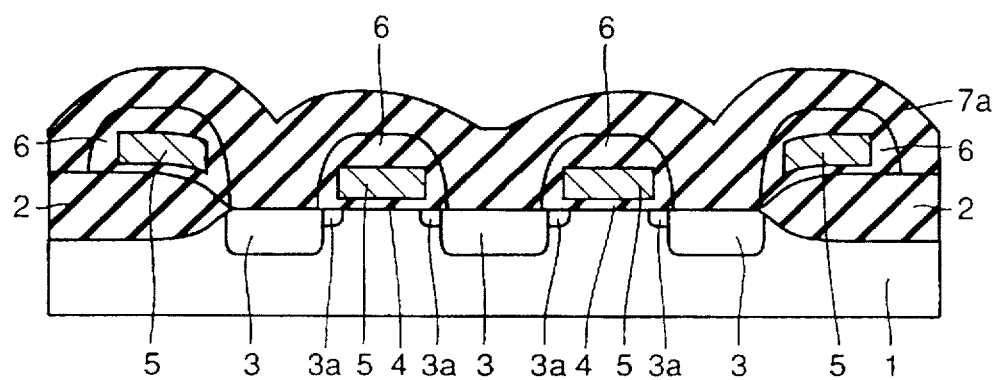
FIGS. 2–10 are cross sectional views showing the first to the ninth steps of manufacturing a semiconductor memory device in the first embodiment of the present invention.
Figure 3:
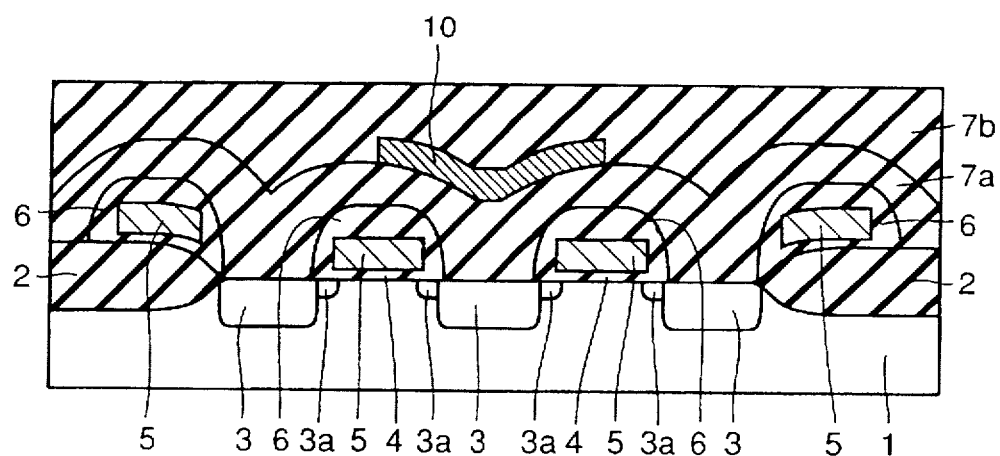

Referring to FIG. 2 first, a semiconductor memory device is manufactured, up to an interlayer insulating layer 7a, through the same process steps as those of the conventional example. A conductive layer (not shown) is then formed on interlayer insulating layer 7a by sputtering, CVD or the like. Next, interconnection layer 10 is formed by patterning the conductive layer such that interconnection layer 10 covers prescribed $n^+$ impurity diffusion layer 3 and does not overlap $n^+$ impurity diffusion layer 3 adjacent to the prescribed $n^+$ impurity diffusion layer 3 as illustrated in FIG. 3. Interlayer insulating layer 7b formed of silicon oxide film or the like is provided by, e.g., CVD method to cover interconnection layer 10.

Figure 4:
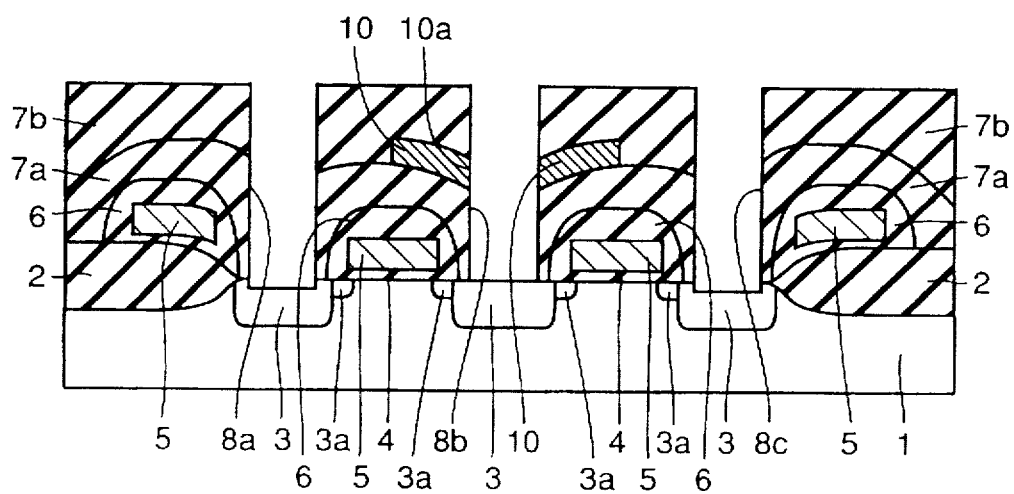

Referring to FIG. 4, contact holes 8a and 8c for connecting capacitor 16 with $n^+$ impurity diffusion layer 3, and a contact hole 8b for providing bit line 11 are formed simultaneously. Therefore, only one photo mask is required and the manufacturing process is substantially simplified since contact holes 8a–8c can be formed in one etching process.

However, when contact holes 8a–8c are formed, the following points should be taken into consideration. In order to provide contact hole 8b, both etching of interconnection layer 10 and etching of interlayer insulating layers 7a and 7b are necessary. Therefore, a process step is required wherein firstly interlayer insulating layer 7b is selectively etched until reaching the surface of interconnection layer 10, secondly interconnection layer 10 is selectively etched, and thirdly interlayer insulating layer 7a is selectively etched.

In this case, when it is assumed that interlayer insulating layers 7a and 7b are formed of silicon oxide film and interconnection layer 10 is formed of polycrystalline silicon doped with impurity, polycrystalline silicon is more easily etched than silicon oxide film, so that a recessed portion is formed on the major surface of semiconductor substrate 1 located under contact holes 8a and 8c as shown in FIG. 4.

Figure 5:
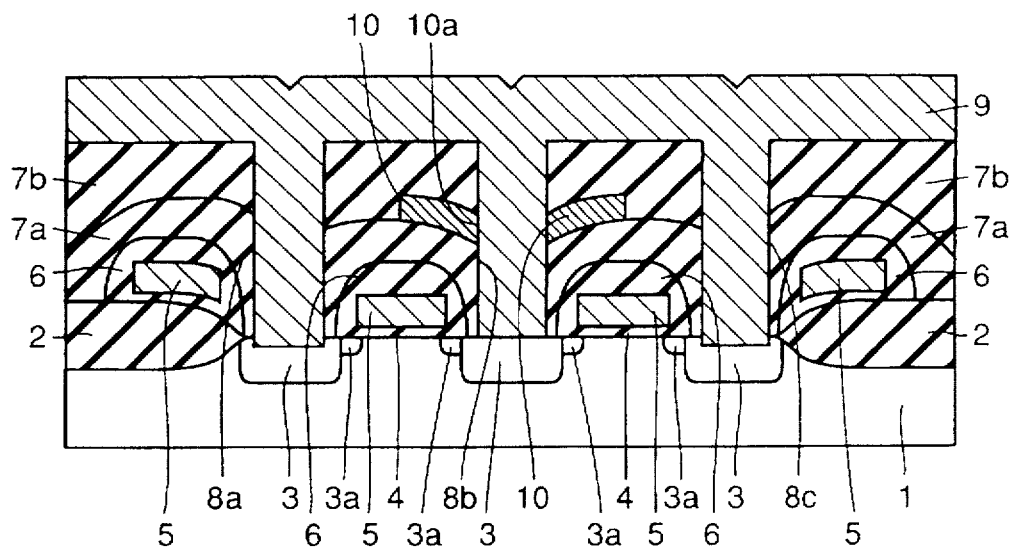
Figure 6:
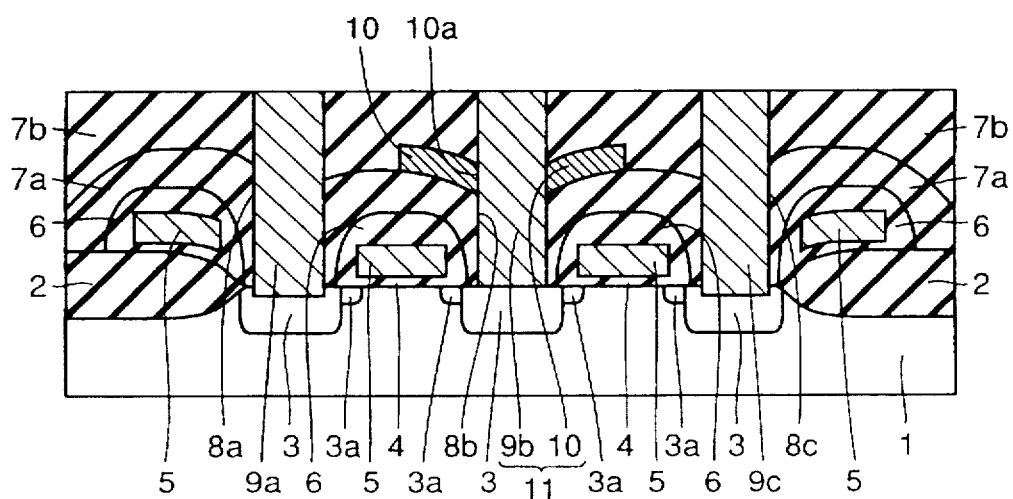

With reference to FIG. 5, a polycrystalline silicon layer 9 is formed by CVD or the like such that it fills contact holes 8a, 8b and 8c. Next, the thickness of polycrystalline silicon layer 9 is reduced from the top surface thereof using etch back method, CMP (Chemical Mechanical Polishing) or the like, whereby plug electrodes 9a and 9c and column-like portion 9b are formed respectively.

Figure 7:
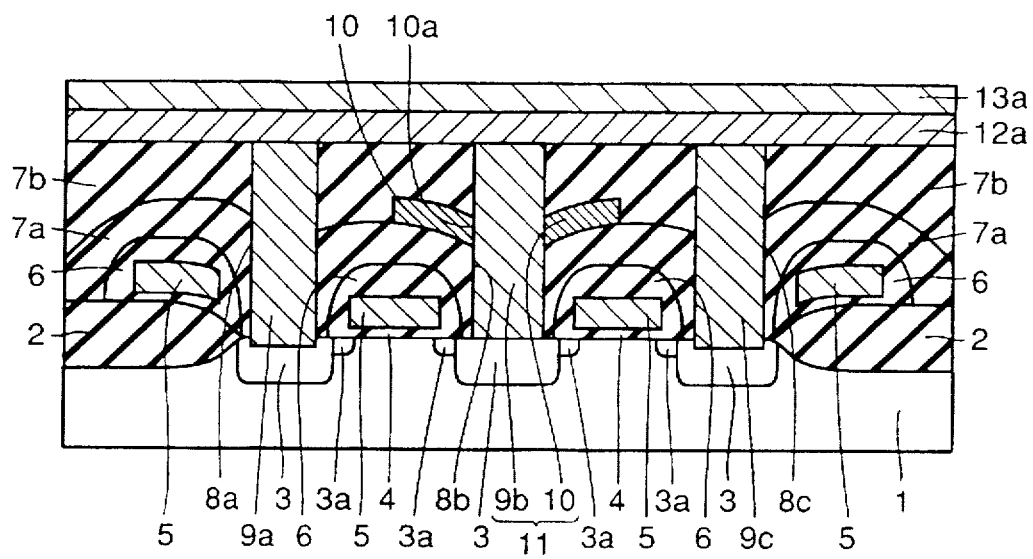

Referring to FIG. 7 next, a barrier layer 12a formed, e.g., of Ti/TiN stacked film is deposited using sputtering or the like, and a lower electrode material layer 13a formed, e.g., of Pt film is deposited on barrier layer 12a by the sputtering or the like.

Figure 8:
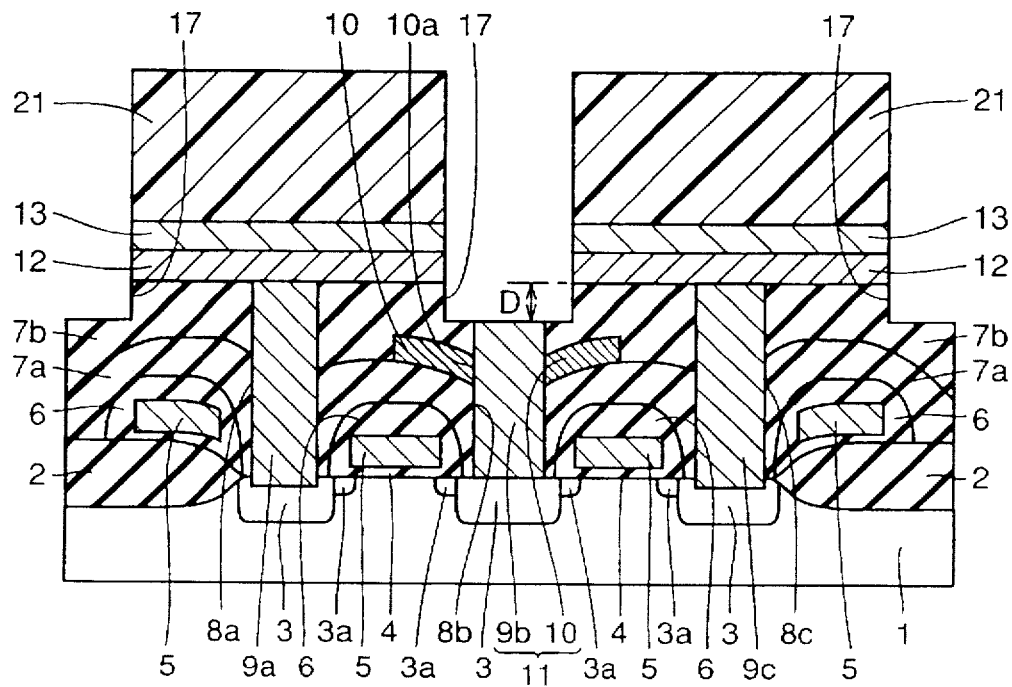

With reference to FIG. 8, above described lower electrode material layer 13a is coated with a photo resist 21, then photo resist 21 is patterned to a prescribed shape. At this time, sputter etching is adopted since material such as Pt, Ti/TiN are not easily etched by chemical dry etching method. When this sputter etching method is used, each material is etched uniformly regardless of the etch selectivity of the material being used. Lower electrode material layer 13a and barrier layer 12 are successively etched using photo resist 21 as a mask by such sputter etching method. Then lower electrode 13 of capacitor 16 is formed, at the same time trenches 17 are provided such that they sandwich lower electrode 13.

It is noted that if the thickness of interlayer insulating layer 7b on interconnection layer 10 is approximately 200 nm, the amount of over-etching when sputter etching above is applied may be set to about 50 nm to about 100 nm. Accordingly, as shown in FIG. 8, the depth D from the bottom of barrier layer 12 to the bottom of trench 17 is about 50 nm to about 100 nm and column-like porion 9b is protruded about 100 nm to 150 nm from the top surface of interconnection layer 10. Therefore, the height of column-like portion 9b from the major surface of semiconductor substrate 1 is lower than the height of plug electrodes 9a and 9c from the major surface of semiconductor substrate 1.

Figure 9:
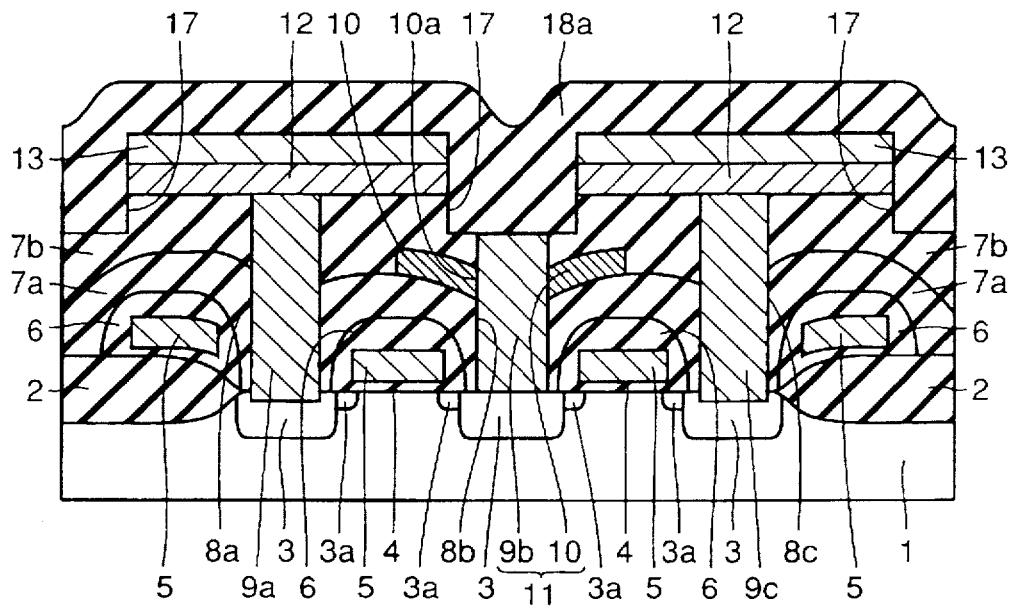
Figure 10:
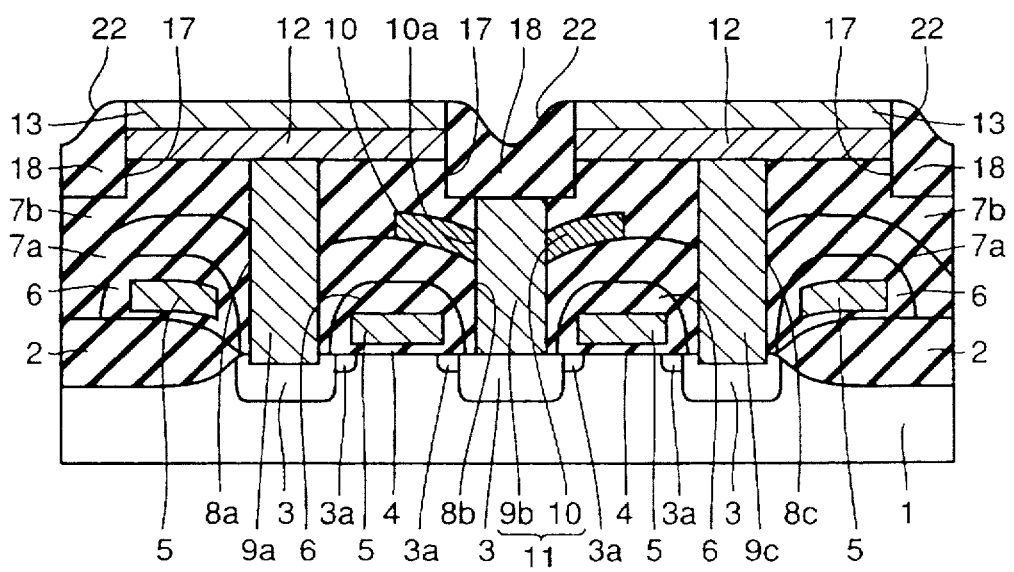

Next, after photo resist 21 is removed, a silicon oxide film 18a is deposited to cover trench 17 and lower electrode 13 by CVD or the like as illustrated in FIG. 9. Silicon oxide film 18a is etched by anisotropic dry etching, whereby buried oxide film 18 is formed as shown in FIG. 10. At this time, although concave portion 22 is generated on the upper surface of buried oxide film 18, the shape of the upper surface can be formed to have a gentle slope by adjusting the thickness of oxide film 18a appropriately.

After the steps above, a dielectric film 14, an upper electrode 15, an interlayer insulating layer 19, and a metal interconnection layer 20 are formed through the process steps that are similar to those of the conventional method. Thus, the semiconductor memory device shown in FIG. 1 is completed through those steps described above.

Figure 11:
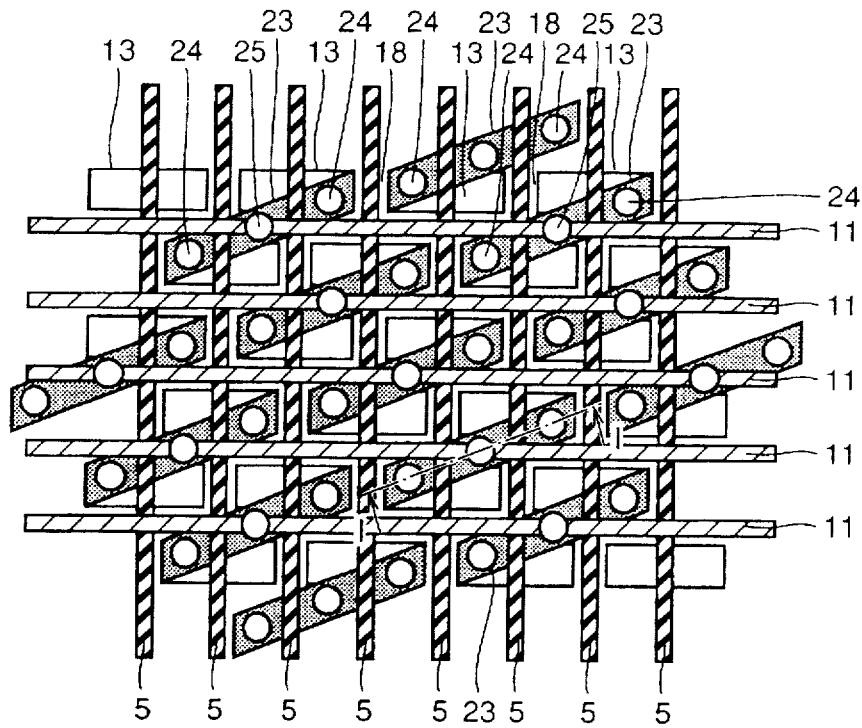
FIG. 11 is a plan view showing one example of a layout of a memory cell of a semiconductor memory device according to the present invention.
Figure 12:
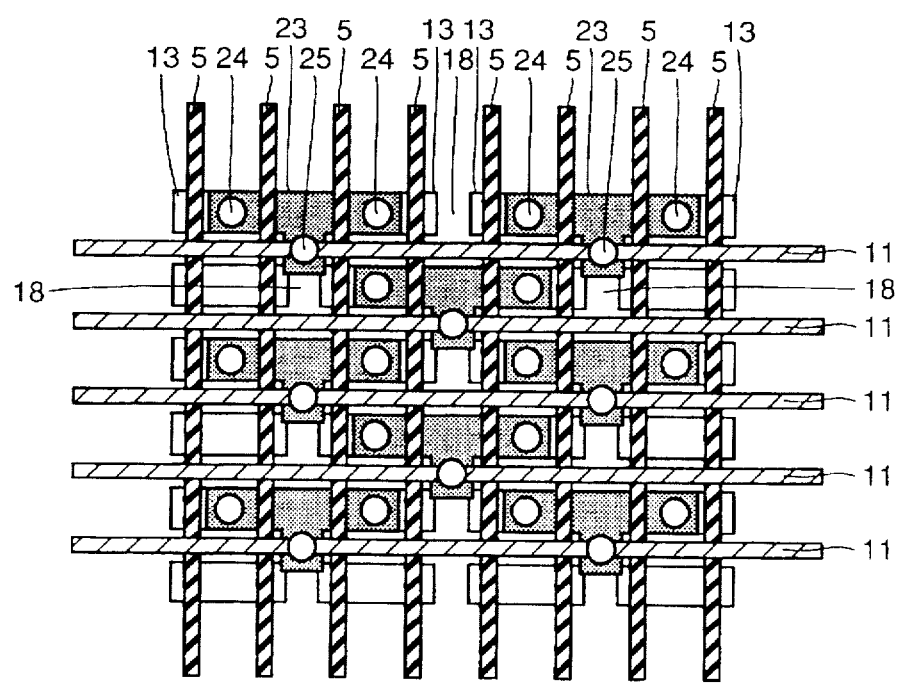
FIG. 12 is a plan view of another example of a layout of a memory cell of a semiconductor memory device according to the present invention.

With reference to FIGS. 11 and 12, the layout of a memory cell will be described. FIG. 11 is a plan view illustrating the layout of a memory cell of ¼ pitch. FIG. 12 is a plan view illustrating the layout of a memory cell of ½ pitch.

As shown in FIGS. 11 and 12, a gate electrode (word line) 5 and bit line 11 are formed such that they extend in approximately orthogonal direction to each other. Memory element forming area 23 is selectively disposed, on which capacitor contact portions 24 and bit line contact portions 25 are provided. Next, lower electrode 13 of capacitor 16 is selectively formed such that it connects with capacitor contact portion 24. Accordingly, buried oxide film 18 is formed between adjacent lower electrodes 13.

Figure 13:
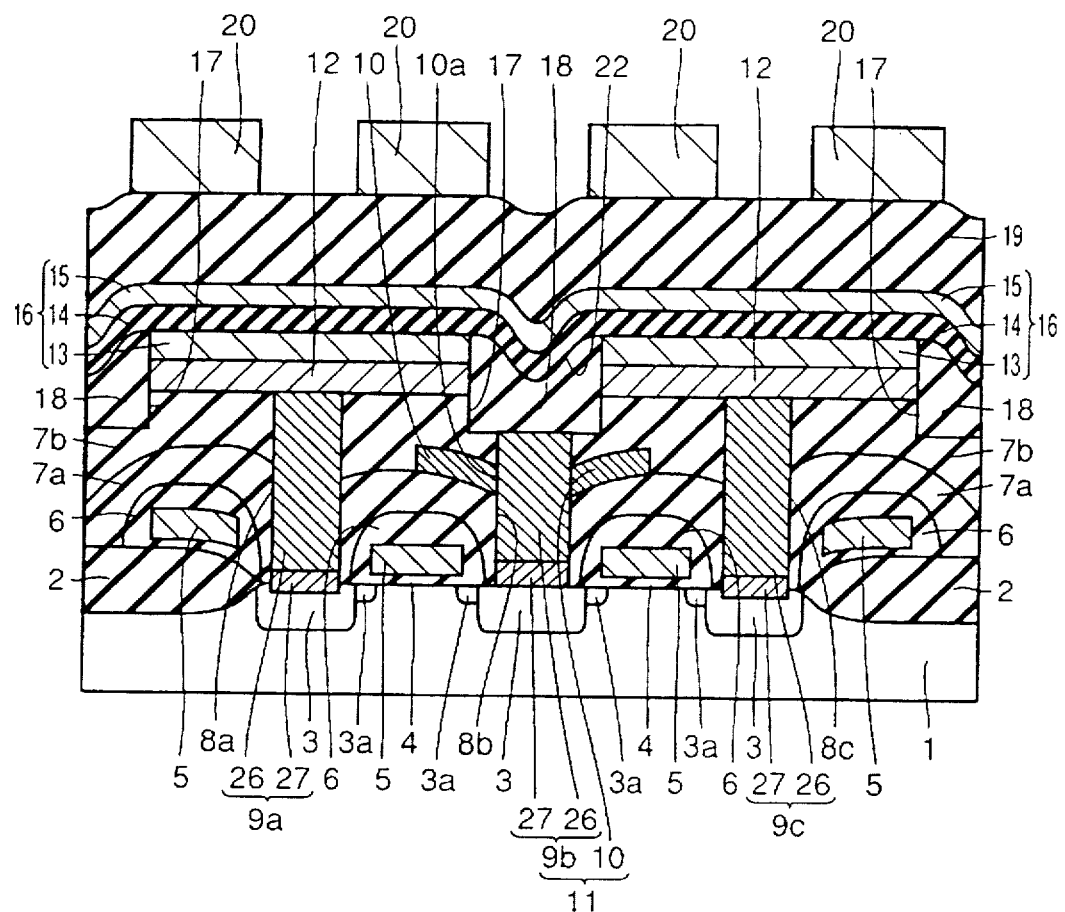
FIG. 13 is a cross sectional view illustrating the first modification of the first embodiment.
Figure 14:
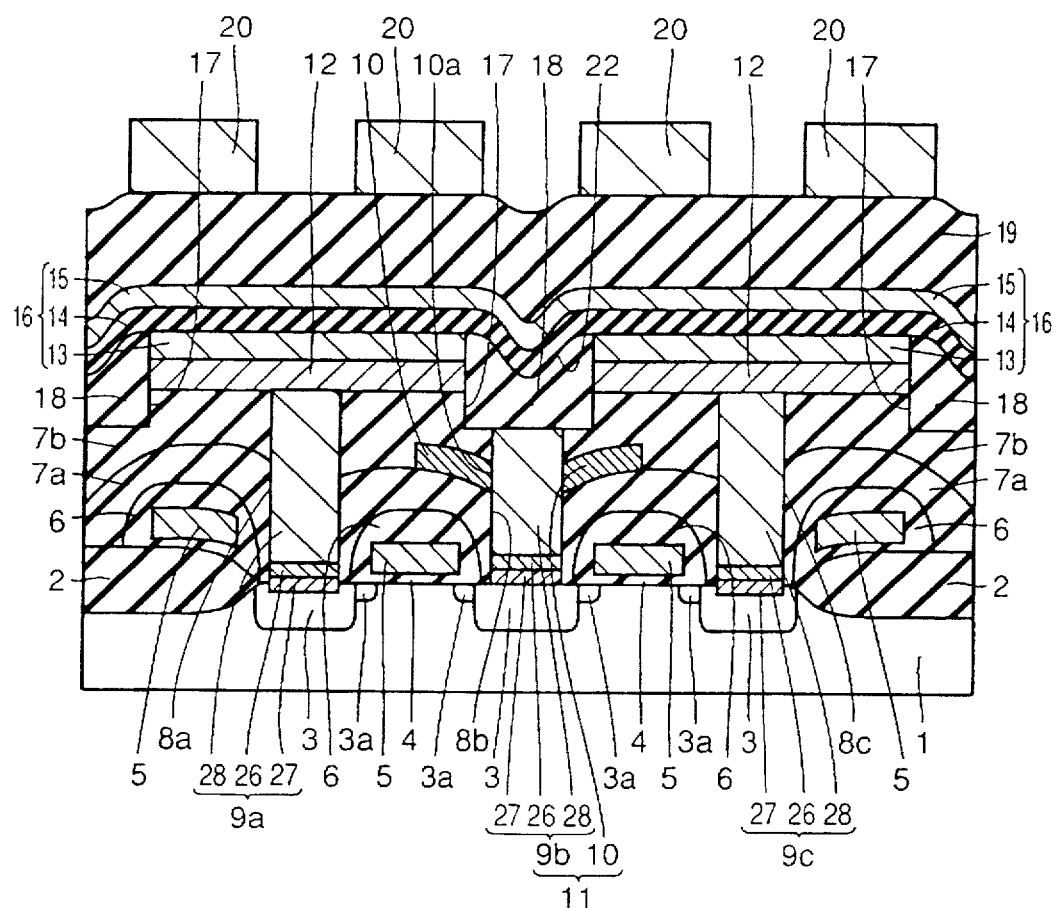
FIG. 14 is a cross sectional view illustrating the second modification of the first embodiment.

Referring to FIGS. 13 and 14, modifications of the semiconductor memory device according to Embodiment 1 shown in FIG. 1 are described.

(Modification 1)

First, with reference to FIG. 13, Modification 1 of the semiconductor memory device shown in FIG. 1 will be described. FIG. 13 is a cross sectional view of a semiconductor memory device according to Modification 1.

Referring to FIG. 13, plug electrodes 9a, 9c and column-like portion 9b each has a stacked structure of a Ti layer 27 and a TiN layer 26. Other structures are similar to those shown in FIG. 1.

(Modification 2)

Next, with reference to FIG. 14, Modification 2 will be described. FIG. 14 is a cross sectional view of a semiconductor memory device according to Modification 2. Referring to FIG. 14, in this modification, plug electrodes 9a, 9c and column-like porion 9b each has a stacked structure of a Ti layer 27, a TiN layer 26 and a W layer 28. Therefore, the resistance of plug electrodes 9a, 9c and bit line 11 can be much more reduced compared with Embodiment 1 described above.

|Embodiment 2|

Figure 15:
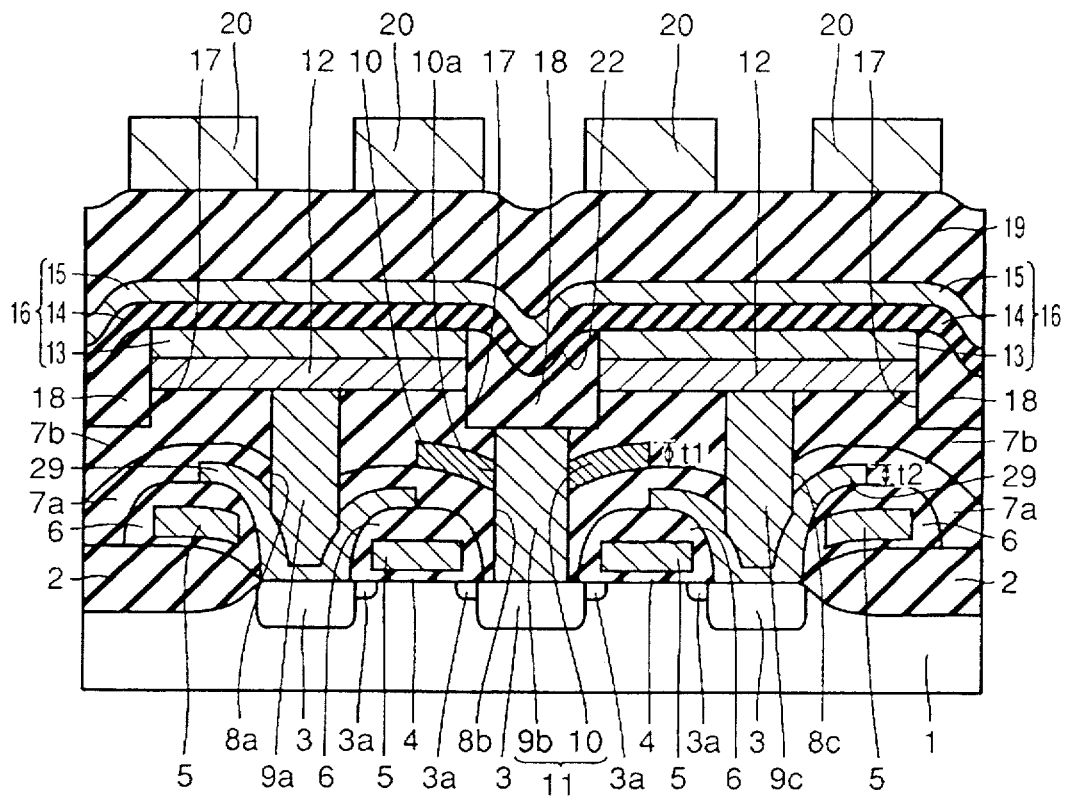
FIG. 15 is a cross sectional view illustrating a semiconductor memory device in the second embodiment of the present invention.

Referring to FIGS. 15-18 next, Embodiment 2 according to the present invention will be described. FIG. 15 is a cross sectional view showing a semiconductor memory device according to Embodiment 2 of the present invention.

With reference to FIG. 15, according to Embodiment 2, a polycrystalline silicon pad layer 29 is formed between plug electrodes 9a, 9c and semiconductor substrate 1. Other structures are similar to those of the semiconductor memory device shown in FIG. 1.

Accordingly, by providing polycrystalline silicon pad layer 29, it is possible to effectively prevent the formation of a recessed portion on the major surface of semiconductor substrate 1 located immediately under plug electrodes 9a and 9c. It is noted that a recessed portion is formed on polycrystalline silicon pad layer 29 and that the bottom surfaces of plug electrodes 9a, 9c are positioned in the recess portion.

Figure 18:
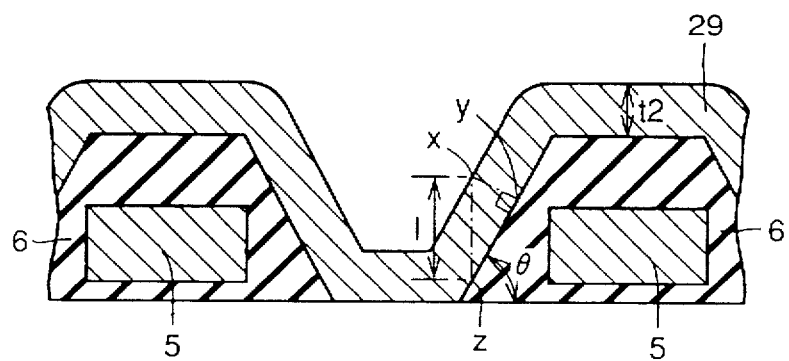
FIG. 18 is a schematic view for presenting a description concerning the thickness of the polycrystalline silicon pad layer 29.

Referring to FIG. 18, the following is a description of the thickness $t_2$ of polycrystalline silicon pad layer 29. FIG. 18 schematically shows polycrystalline silicon pad layer 29 and its peripheral structures. It is noted that field oxide film 2 is not shown for convenience.

With reference to FIG. 18, let us assume that the side wall of the contact hole where polycrystalline silicon pad layer 29 is formed has a slope angle θ, and that there is an imaginary triangle xyz. The slope angle θ of the side wall of the contact hole is assumed to be about 45° to about 60°.

In this case, the length 1 of the side xz of the triangle xyz is represented as $t_2/\cos θ$. Then 1 will be represented as $\sqrt{2} \cdot t2 \leq 1 \leq 2 \cdot t2$ when the value of θ is 45° to 60°. If l=t1 (the thickness of interconnection layer 10 formed of polycrystalline silicon), the thickness t2 of polycrystalline silicon pad layer 29 is represented as $t1/2 \leq t2 \leq t1/\sqrt{2}$.

In view of the relations above, the thickness t2 of polycrystalline silicon pad layer 29 which is about 50% to about 80% of the thickness t1 of interconnection layer 10 is enough. Since polycrystalline silicon pad layer 29 has such a thickness, it is possible to effectively prevent the formation of the recessed portion on the major surface of semiconductor substrate 1. The patterning of the polycrystalline silicon pad layer 29 also become easy by thus making polycrystalline silicon pad layer 29 thin.

Figure 16:
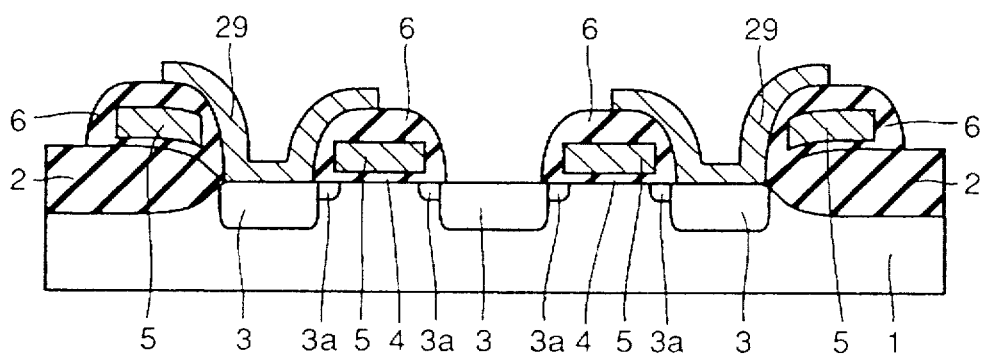
FIGS. 16 and 17 are cross sectional views showing the characteristic first and second process steps of the manufacturing process of a semiconductor memory device in the second embodiment.
Figure 17:
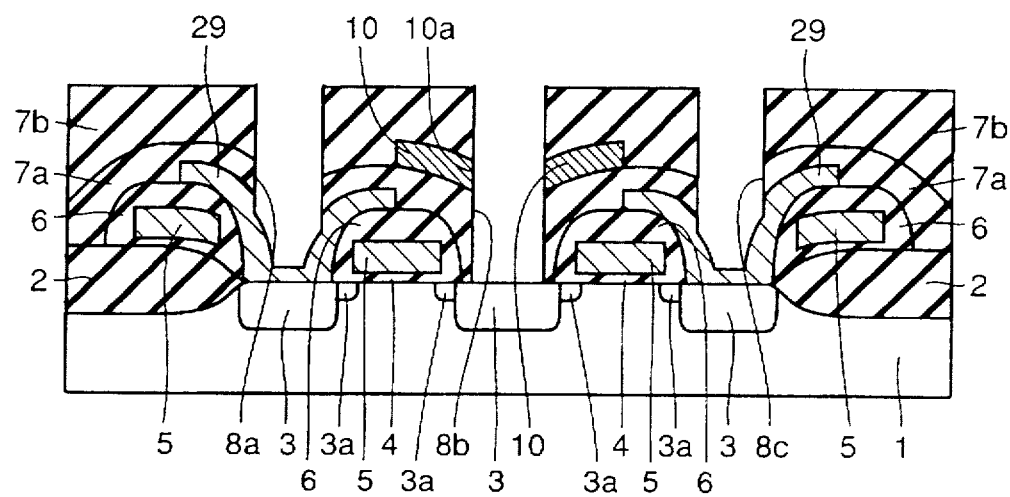

Next, with reference to FIGS. 16 and 17, a manufacturing method of the semiconductor memory device according to Embodiment 2 of the present invention shown in FIG. 15 will be described. FIGS. 16 and 17 are cross sectional views illustrating the characteristic first and second process steps of the semiconductor memory device manufacturing process according to Embodiment 2.

Referring to FIG. 16 first, up to insulating layer 6 is formed through similar process steps to those of Embodiment 1. Next, a polycrystalline silicon layer doped with impurity is formed such that it covers insulating layer 6 and the major surface of semiconductor substrate 1. Polycrystalline silicon pad layer 29 is then formed by patterning the polycrystalline silicon layer.

Referring to FIG. 17, interlayer insulating layers 7a, 7b and interconnection layer 10 are formed in the similar manner to that of Embodiment 1. After that, contact holes 8a, 8b, 8c are respectively formed through the similar steps to that of Embodiment 1. At this time, by providing polycrystalline silicon pad layer 29, a recessed portion is generated on the surface of polycrystalline silicon pad layer 29. However, there is not a recessed portion on the major surface of semiconductor substrate 1. The semiconductor memory device shown in FIG. 15 is thereafter completed through the same process steps as those of Embodiment 1 described above.

[Embodiment 3]

Figure 19:
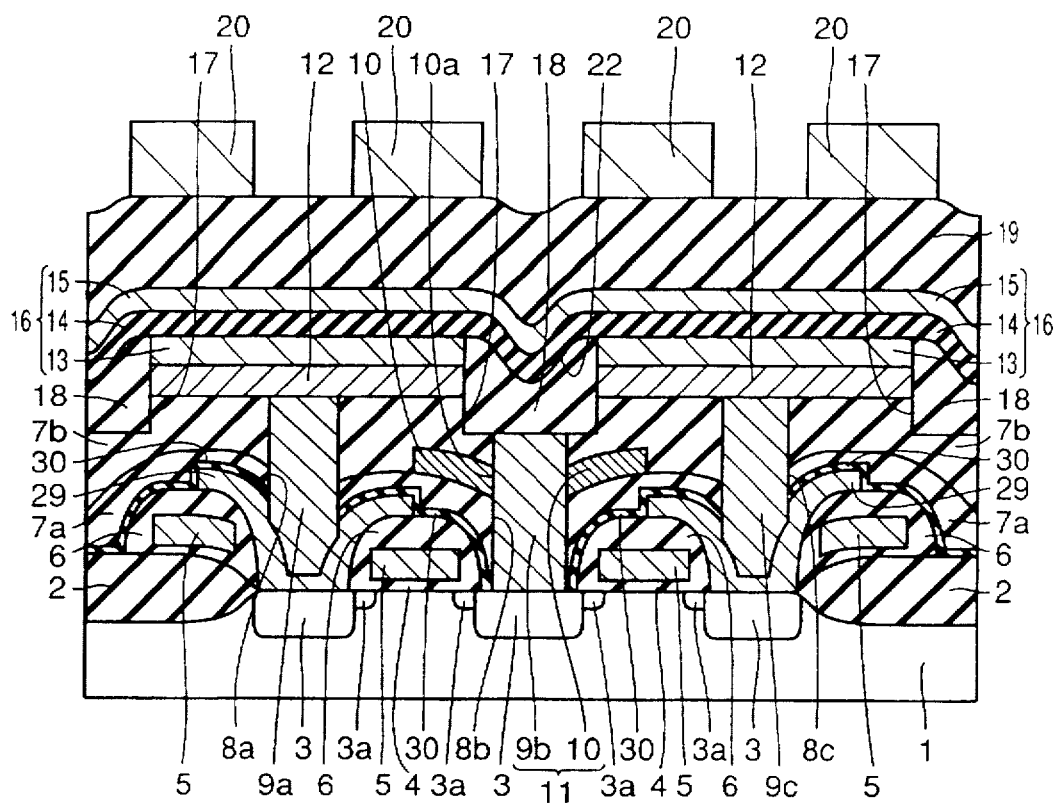
FIG. 19 is a cross sectional view showing a semiconductor memory device in the third embodiment of the invention.

With reference to FIGS. 19–22 next, Embodiment 3 of the present invention will be described. FIG. 19 is a cross sectional view of a semiconductor memory device according to Embodiment 3 of the present invention.

Referring to FIG. 19, according to Embodiment 3, a silicon nitride film 30 is formed on insulating layer 6 to cover gate electrode 5. Since silicon nitride film 30 is provided, etching of gate electrode 5 is effectively prevented even if contact holes 8a, 8b and 8c are misaligned. It is noted that another insulating layer formed of material different from that of interlayer insulating layer 7a may be used in place of silicon nitride film 30.

Figure 20:
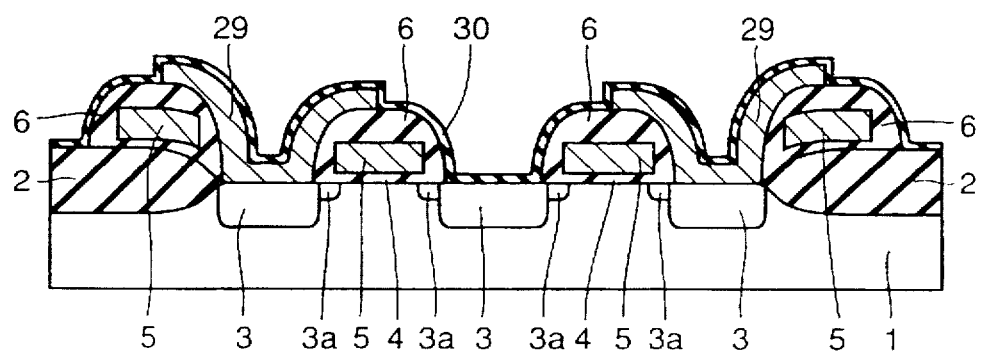
FIGS. 20 and 21 are cross sectional views showing the characteristic first and second process steps of the manufacturing process of a semiconductor memory device in the third embodiment.
Figure 21:
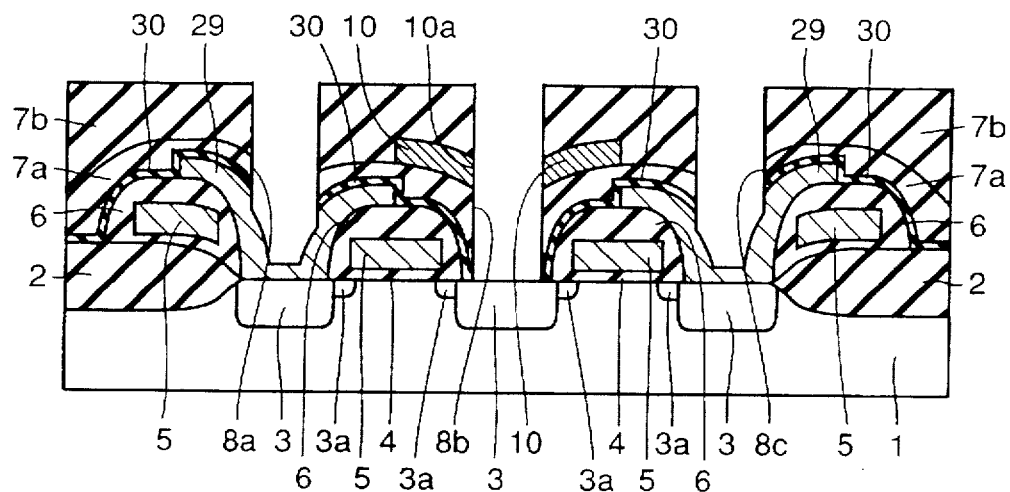

The manufacturing method of the semiconductor memory device according to Embodiment 3 will be described with reference to FIGS. 20 and 21. FIGS. 20 and 21 are cross sectional views illustrating the characteristic first and second process steps of the manufacturing process of the semiconductor memory device according to Embodiment 3.

Referring to FIG. 20, up to polycrystalline silicon pad layer 29 is provided through the process steps similar to those of Embodiment 2. Then silicon nitride film 30 is formed by CVD or the like to cover gate electrode 5, insulating layer 6 and polycrystalline silicon pad layer 29.

Next, interlayer insulating layers 7a and 7b and interconnection layer 10 are provided through the steps similar to those of Embodiment 1. Contact holes 8a, 8b and 8c are formed using photolithography and etching. At this time, the step of etching silicon nitride film 30 is required in addition to the step of etching in the process of Embodiment 1. After that, the semiconductor memory device shown in FIG. 19 is formed through steps similar to those of Embodiment 1.

Figure 22:
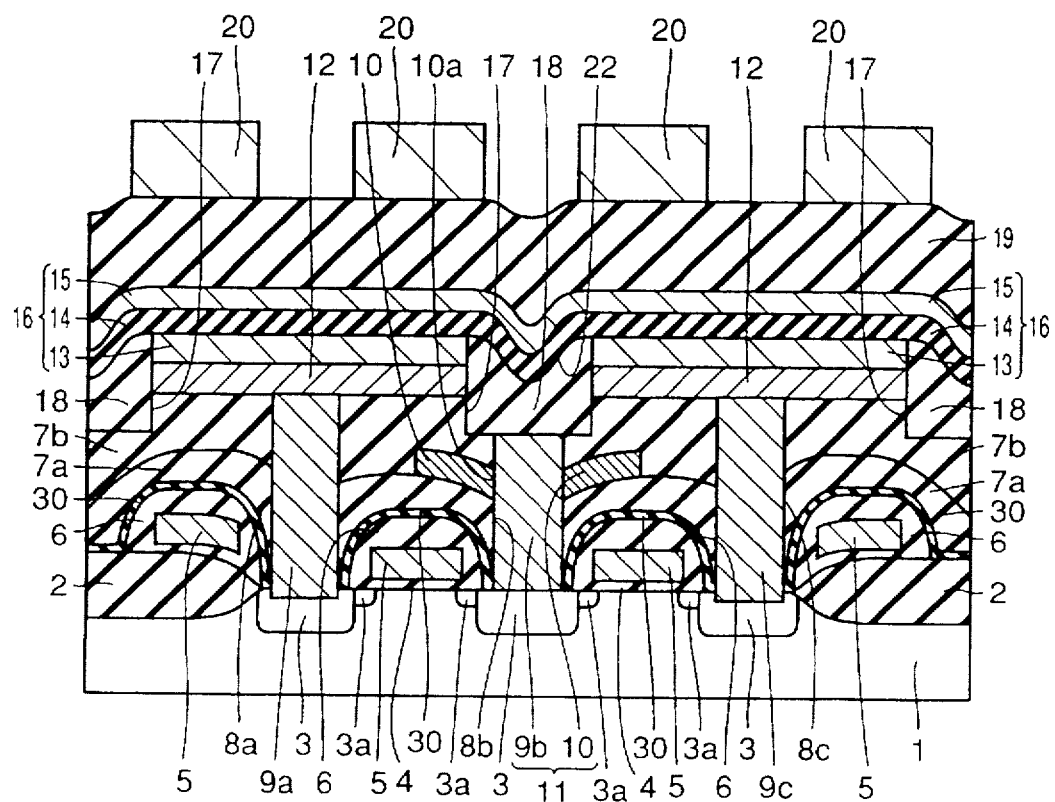
FIG. 22 is a cross sectional view showing a modification of the third embodiment.

With reference to FIG. 22, a modification of Embodiment 3 will be described. FIG. 22 is a cross sectional view of a semiconductor memory device according to the modification of Embodiment 3.

Referring to FIG. 22, silicon nitride film 30 is formed to cover insulating layer 6 and gate electrode 5, and polycrystalline silicon pad layer 29 is not provided in this modification. Other structures are almost similar to those of Embodiment 1 shown in FIG. 1. This modification offers an effect almost the same as that of Embodiment 3 described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor substrate of a first conductivity type having a major surface;
   first and second impurity diffusion layers of a second conductivity type formed with a space therebetween, defining a channel region at the major surface of said semiconductor substrate;
   a gate electrode formed on said channel region with a gate insulating layer interposed;
   a bit line formed on said first impurity diffusion layer, and having a protruded portion at the upper surface located above a contact portion with said first impurity diffusion layer; and
   a capacitor electrically connected with said second impurity diffusion layer, wherein
   said bit line includes a column-like portion extending upward, formed on the surface of said first impurity diffusion layer, and a film-like portion, having a hole therein, connected to said column-like portion by receiving said column-like portion within said hole and extending in a direction almost parallel to the major surface of said semiconductor substrate, and
   an upper portion of said column-like portion is protruded from the top surface of said film-like portion thereby forming said protruded portion.

2. The semiconductor memory device according to claim 1, wherein
   material of said column-like portion is different from that of said film-like portion.

3. The semiconductor memory device according to claim 1, wherein
   a first interlayer insulating layer is formed to cover said gate electrode,
   a second interlayer insulating layer is formed on said first interlayer insulating layer,
   a first contact hole is formed to penetrate through said first interlayer insulating layer to reach said first impurity diffusion layer,
   said film-like portion is formed on said first interlayer insulating layer so that the hole of said film-like portion is located on said first contact hole,
   said column-like portion is formed to extend within said first contact hole and within said hole of said film-like portion,
   a second contact hole penetrating through said first and second interlayer insulating layers is formed on said second impurity diffusion layer,
   a plug electrode electrically connecting said capacitor with said second impurity diffusion layer is formed within said second contact hole, and
   said column-like portion and said plug electrode are formed of same material.

4. The semiconductor memory device according to claim 3, wherein
   a lower electrode of said capacitor is formed on said second interlayer insulating layer to be electrically connected with said plug electrode,
   first and second trenches each having a bottom surface within said second interlayer insulating layer are formed to sandwich said lower electrode,
   the upper surface of said column-like portion constitutes a part of the bottom surface of said first trench,
   a buried insulating layer with a gently sloped upper surface is formed within said first and second trenches, covering almost all of the inner surface of the first and the second trenches,
   a dielectric film of said capacitor is formed to cover said lower electrode and said buried insulating layer, and
   an upper electrode of said capacitor is formed on said dielectric film.

5. The semiconductor memory device according to claim 3, wherein
   height of the upper surface of said plug electrode from the major surface of said semiconductor substrate is greater than that of the upper surface of said column-like portion from the major surface of said semiconductor substrate.

6. The semiconductor memory device according to claim 3, wherein a pad conductive layer is formed between said plug electrode and said second impurity diffusion layer.

7. The semiconductor memory device according to claim 6, wherein thickness of said pad conductive layer is about 50% to about 80% of that of said film-like portion.

8. The semiconductor memory device according to claim 3, wherein an insulating layer formed of material different from that of said first interlayer insulating layer is formed within said first interlayer insulating layer to cover said gate electrode.

* * * * *